(12) United States Patent
Mori et al.

(10) Patent No.: US 6,351,479 B1
(45) Date of Patent: Feb. 26, 2002

(54) SEMICONDUCTOR LASER HAVING EFFECTIVE OUTPUT INCREASING FUNCTION

(75) Inventors: Hiroshi Mori, Atsugi; Yasuhiro Kanaya, Isehara; Yasuaki Nagashima; Tomoyuki Kikugawa, both of Atsugi; Yoshinori Nakano, Yokohama, all of (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 09/307,438

(22) Filed: May 10, 1999

(30) Foreign Application Priority Data

May 14, 1998 (JP) .......................... 10-131800

(51) Int. Cl.[7] .............................. H01S 5/00
(52) U.S. Cl. ................................. 372/45
(58) Field of Search ..................... 372/45, 46

(56) References Cited

U.S. PATENT DOCUMENTS 4,809,287 A  2/1989  Ohba et al.
5,079,184 A  1/1992  Hatano et al.

FOREIGN PATENT DOCUMENTS

EP  0 571 021 A1  11/1993
EP  0 805 533 A1  11/1997
JP  6-222406  8/1994
JP  7-193321  7/1995
JP  9-45989  2/1997

OTHER PUBLICATIONS

Patent Abstracts of Japan, vol. 1996, No. 01, Jan. 31, 1996 and JP 07–245447 A (NEC Corp.), Sep. 19, 1995—Abstract.
Patent Abstracts of Japan, vol. 1996, No. 01, Jan. 31, 1996 and JP 07–249575 A (Nippon Telegraph & Telephone Corp.), Sep. 26, 1995—Abstract.
Patent Abstracts of Japan, vol. 1999, No. 05, May 31, 1999 and JP 11–054828 A (Sharp Corp.), Feb. 26, 1999—Abstract.

*Primary Examiner*—Teresa M. Arroyo
*Assistant Examiner*—Jeffrey N Zahn
(74) *Attorney, Agent, or Firm*—Frishauf, Holtz, Goodman, Langer & Chick, P.C.

(57) ABSTRACT

Disclosed is a semiconductor laser capable of preventing diffusion of a p-type dopant to an active layer while performing sufficient carrier blocking, even when Zn is used as a p-type dopant, and obtaining high emission efficiency and high output by minimizing light absorption in a p-type cladding layer. This semiconductor laser includes an active layer and p-type cladding layer on an n-type semiconductor substrate. The concentration distribution of a p-type dopant from the active layer to the p-type cladding layer has a maximum value at a distance of 50 to 250 nm from the end of the active layer.

9 Claims, 2 Drawing Sheets

SEMICONDUCTOR LASER HAVING EFFECTIVE OUTPUT INCREASING FUNCTION

BACKGROUND OF THE INVENTION

The present invention relates to a semiconductor laser and, more particularly, to a semiconductor laser characterized by a carrier block portion for an active layer.

As is well known, a semiconductor laser is a light emitting device used in a broad range of fields such as optical communication, various optical measurements, and optical recording.

The characteristics required of this semiconductor laser slightly vary from one application to another. However, high output is a common subject to all fields.

FIG. 5 shows the structure of a 1.48-$\mu$m semiconductor laser for exciting an erbium-doped fiber amplifier used in the field of optical fiber communication.

In this semiconductor laser, a mesa structure is formed on an n-type InP substrate 51.

In this mesa structure, an InGaAsP separate confinement heterostructure (SCH) layer 52, an InGaAsP active layer 53, an InGaAsP SCH layer 54, and a p-type InP cladding layer 55 are stacked in this order.

The InGaAsP SCH layers 52 and 54 have a bandgap intermediate between the active layer 53 and the InP layers 51 and 55 and can have either a uniform structure or an internal refractive index distribution (to be referred to as a GRIN structure hereinafter).

The InGaAsP active layer 53 often has a multiple quantum well structure (MQW) in which quantum well layers and barrier layers are stacked, rather than a bulk structure.

In the remainder of this specification, when a term "active layer" is used it doesn't matter whether the active layer has a bulk structure or an MQW structure.

Likewise, when a term "SCH layer" is used in this specification, it doesn't matter whether the SCH layer has a uniform refractive index or a GRIN structure.

A p-type InP buried layer 56 and an n-type InP buried layer 57 are buried in the two sides of the mesa to contribute to the constriction of a current path and the formation of a stripe optical waveguide.

A p-type InGaAs contact layer 58 is formed on the p-type InP cladding layer 55 in many instances.

A semiconductor layer is completed by forming metal electrodes on the two surfaces of the semiconductor crystal thus formed.

Output of a semiconductor laser like this can be increased by many factors. Among other factors, it is important to allow radiative recombination at high probability of carriers (electrons and holes) injected into the active layer.

To this end, it is desirable to block carriers overflowing from the active layer by a p-type dopant in the cladding layer and thereby enhance the confinement of carriers to the active layer.

A semiconductor laser like this often uses metal organic vapor phase epitaxy (MOVPE) having high mass productivity for crystal growth, Zn as a p-type dopant, and Si as an n-type dopant.

The doping amounts of these dopants control the carrier concentration in a semiconductor.

The higher the carrier concentration, the better the electrical characteristics. However, as particularly holes readily absorb light, caution should be exercised on the carrier concentration in the p-type cladding layer.

That is, it is necessary to take account of not only the active layer carrier blocking effect described above but also the light absorbing effect of holes.

Additionally, when Zn is used as a p-type dopant, the problem of diffusion in heating steps must be taken into consideration.

More specifically, if the concentration of a p-type dopant in a cladding layer near an active layer is high, Zn easily diffuses in the crystal. Consequently, Zn enters the active layer (a well layer in the case of an MQW structure) which is supposed to be undoped. This Zn functions as the source of non-radiative recombination and degrades the laser characteristics. This is known to those skilled in the art.

To obtain a doping concentration distribution in a p-type cladding layer by which this Zn diffusion to an active layer is prevented, Jpn. Pat. Appln. KOKAI Publication No. 7-193321 has disclosed a technique which decreases the doping concentration near an active layer and increases the doping concentration in a direction away from the active layer.

Also, to suppress unnecessary absorption of light while blocking electrons from an active layer, Jpn. Pat. Appln. KOKAI Publication No. 9-45989 uses a method in which only a thin layer near an active layer is heavily doped and layers above this thin layer are lightly doped.

This method uses C or Mg as a dopant instead of Zn which is readily diffusible.

In the technique disclosed in Jpn. Pat. Appln. KOKAI Publication No. 7-193321, however, the dopant concentration in a cladding layer gradually increases from an active layer. This makes it difficult to sufficiently block electrons overflowing from the active layer in the vicinity of the active layer.

In this technique, therefore, electrons easily overflow from an active layer, so it is impossible to allow effective radiative recombination of a current injected into the active layer. Hence, the technique is unsuited to increasing the output of a semiconductor laser.

In the method disclosed in Jpn. Pat. Appln. KOKAI Publication No. 9-45989, C or Mg must be used to suppress diffusion of a dopant to an active layer.

Unfortunately, these materials have lower purities and higher prices than those of Zn and hence cannot be generally used as a p-type dopant.

BRIEF SUMMARY OF THE INVENTION

The present invention has been made in consideration of the above situation, and has as its object to provide a semiconductor laser capable of preventing diffusion of a p-type dopant to an active layer while performing sufficient carrier blocking, even when Zn is used as a p-type dopant, and obtaining high emission efficiency and high output by minimizing light absorption in a p-type cladding layer.

To achieve the above object, according to one aspect of the present invention, there is provided a semiconductor laser having a stacked structure including an n-type semiconductor substrate, an active layer, and a p-type cladding layer formed on the active layer, wherein the p-type cladding layer is formed such that regions doped with a p-type dopant are formed in an order of a first lightly doped region, a heavily doped region, and a second lightly doped region from a region closest to the active layer in a stacking direction, and a maximum value of concentration of the p-type dopant exists in the heavily doped region within a range of 50 to 250 nm in the stacking direction from the active layer.

According to another aspect of the present invention, there is provided a semiconductor laser comprising:

an n-type semiconductor substrate;

an active layer formed on the n-type semiconductor substrate; and a p-type cladding layer formed by doping a p-type dopant into the form of a stacked structure on the active layer, the p-type cladding layer comprising:

a p-type dopant diffusion preventing layer formed in a region near the active layer to prevent diffusion of the p-type dopant to the active layer during fabrication process of the semiconductor laser;

a carrier blocking layer formed on the p-type dopant diffusion preventing layer to block carriers overflowing from the active layer and confine the carriers in the active layer when the semiconductor laser is in operation; and a light absorption inhibiting layer formed on the carrier blocking layer to inhibit absorption of light by holes when the semiconductor laser is in operation).

According to still another aspect of the present invention, there is provided a method of fabricating a semiconductor laser, comprising the steps of:

forming an active layer on an n-type semiconductor substrate; and forming a p-type cladding layer by doping a p-type dopant into the form of a stacked structure on the active layer, the step of forming the p-type cladding layer comprising:

forming a p-type dopant diffusion preventing layer in a region near the active layer to prevent diffusion of the p-type dopant to the active layer during a fabrication process of the semiconductor laser;

forming a carrier blocking layer on the p-type dopant diffusion preventing layer to block carriers overflowing from the active layer and confine the carriers in the active layer when the semiconductor laser is in operation; and forming a light absorption inhibiting layer on the carrier blocking layer to inhibit absorption of light by holes when the semiconductor laser is in operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
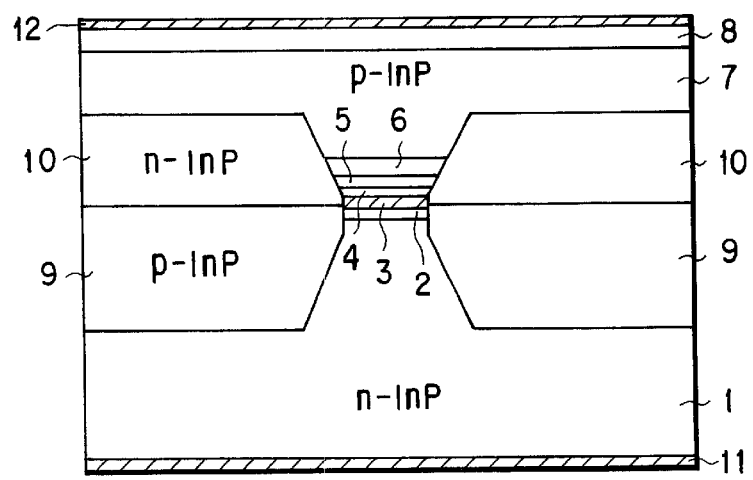
FIG. 1 is a sectional view showing the arrangement of a semiconductor laser according to an embodiment of the present invention.

First, an outline of the present invention will be described below.

To solve the above problems, an invention corresponding to the first aspect is a semiconductor laser having an active layer and a p-type cladding layer on an n-type semiconductor substrate, wherein the concentration distribution of a p-type dopant from the active layer to the p-type cladding layer has a maximum value at a distance of 50 to 250 nm from the end of the active layer.

With this means, the present invention can perform carrier blocking for the active layer in the portion where the p-type dopant concentration has a maximum value.

Also, the distance from the position of this maximum value to the end of the active layer is at least 50 nm, so diffusion of the p-type dopant to the active layer can be prevented. Additionally, since the p-type dopant concentration decreases at least once after the position of the maximum value, light absorption in the p-type cladding layer can be minimized.

Accordingly, a semiconductor laser having high emission efficiency and high output can be realized.

In an invention corresponding to the second aspect, the p-type dopant is zinc (Zn) in the invention corresponding to the first aspect.

In the present invention with this means, a lightly doped dopant region is formed between the active layer and the maximum value. Therefore, even when the p-type dopant is zinc which is readily diffusible, this dopant does not enter the active layer.

Accordingly, the invention corresponding to this second aspect can achieve the same effects as in the invention corresponding to the first aspect and can also prevent degradation of the laser characteristics caused by an increase in non-radiative recombination resulting from mixing of zinc. It is also possible to use, as a dopant, a material which is inexpensive and pure, has been actually used in many applications, and hence is highly reliable.

In an invention corresponding to the third aspect, the material system of the semiconductor is InGaAsP/InP in the invention corresponding to the first or second aspect.

With this means, the present invention can achieve the same effects as in the invention corresponding to the first or second aspect and can also provide a semiconductor laser required to have high output, e.g., a semiconductor laser usable to excite a fiber amplifier in the field of optical communication.

In an invention corresponding to the fourth aspect, the maximum value of the p-type dopant concentration is $1 \times 10^{18}/cm^3$ or more in the inventions corresponding to the first to third aspects.

With this means, the present invention can achieve the same effects as in the inventions corresponding to the first to third aspects and can also perform sufficient carrier blocking.

In an invention corresponding to the fifth aspect, the minimum value of the p-type dopant concentration from the end of the active layer to the heavily doped region maximum value is $3 \times 10^{17}/cm^3$ or less in the inventions corresponding to the first to fourth aspects.

With this means, the present invention can achieve the same effects as in the inventions corresponding to the first to fourth aspects and can also more effectively prevent mixing of the p-type dopant into the active layer.

An invention corresponding to the sixth aspect has a separate confinement heterostructure layer between the active layer and the p-type cladding layer in the inventions corresponding to the first to fifth aspects.

With this means, the present invention can achieve the same effects as in the inventions corresponding to the first to fifth aspects even when the separate confinement heterostructure layer is formed.

In the present invention, the maximum value of the dopant concentration can exist in this separate confinement heterostructure layer.

In an invention corresponding to the seventh aspect, the active layer has a multiple quantum well structure in the inventions corresponding to the first to sixth aspects.

With this means, the present invention can achieve the same effects as in the inventions corresponding to the first to sixth aspects and can also further improve the characteristics.

An invention corresponding to the eighth aspect is a semiconductor laser having an active layer and a p-type cladding layer using zinc as a p-type dopant on an n-type semiconductor substrate, wherein a concentration distribution of the p-type dopant from the end of the active layer to the p-type cladding layer has at least one maximum value with the undoped region or lightly doped region sandwiched between the end of the active layer and the heavily doped region.

With this means, the present invention can achieve the same effects as in the invention corresponding to the second aspect.

An embodiment of the present invention based on the aforementioned outline will be described below.

FIG. 1 is a sectional view showing the arrangement of a semiconductor laser according to the embodiment of the present invention.

This semiconductor laser is constructed in the same manner as the semiconductor laser explained in "BACKGROUND OF THE INVENTION" except for the concentration distribution in p-type cladding layers.

That is, in a mesa structure formed on an n-type InP substrate 1, an InGaAsP separate confinement heterostructure (SHC) layer 2, an InGaAsP active layer 3, an InGaAsP SCH layer 4, and p-type InP cladding layers 5, 6, and 7 are stacked in this order.

The p-type cladding layers are three layers, i.e., the lightly doped p-type cladding layer 5, the heavily doped p-type cladding layer 6, and the moderately doped p-type cladding layer 7 formed in the order named from a layer closest to the active layer 3.

A p-type contact layer 8 is stacked on the moderately doped p-type cladding layer 7.

A p-type InP buried layer 9 and an n-type InP buried layer 10 are buried in the two sides of the mesa to contribute to the constriction of a current path and the formation of a stripe optical waveguide.

Additionally, an n-type electrode 11 and a p-type electrode 12 are formed on the n-type InP substrate 1 and the p-type contact layer 8, respectively, to complete the semiconductor laser.

The dopant used in the p-type cladding layers 5, 6, and 7 is zinc (Zn), and the carrier concentrations in these layers 5, 6, and 7 and the carrier concentration distribution in the direction of thickness of these layers are important.

Figure 2:
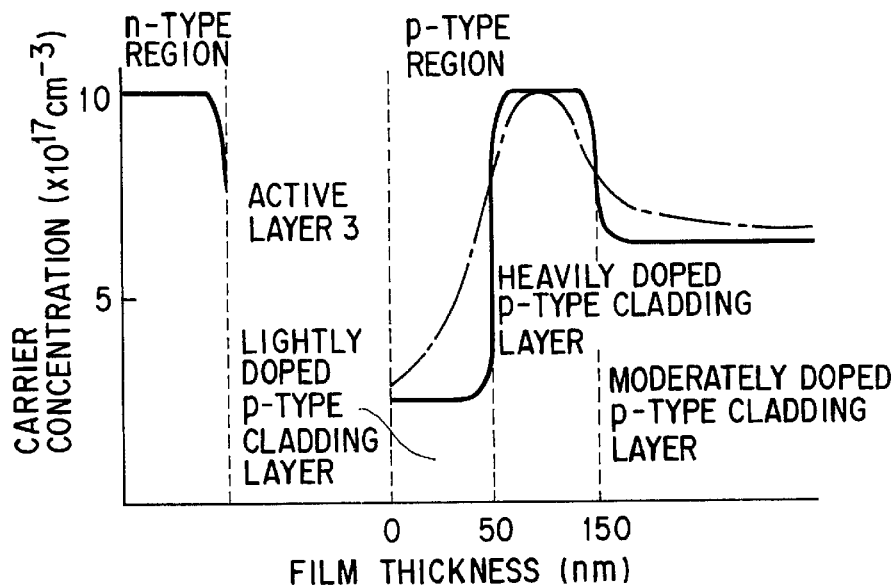
FIG. 2 is a graph showing an example of the carrier concentration distribution in p-type cladding layers in the semiconductor laser according to the embodiment of the present invention.
Figure 5:
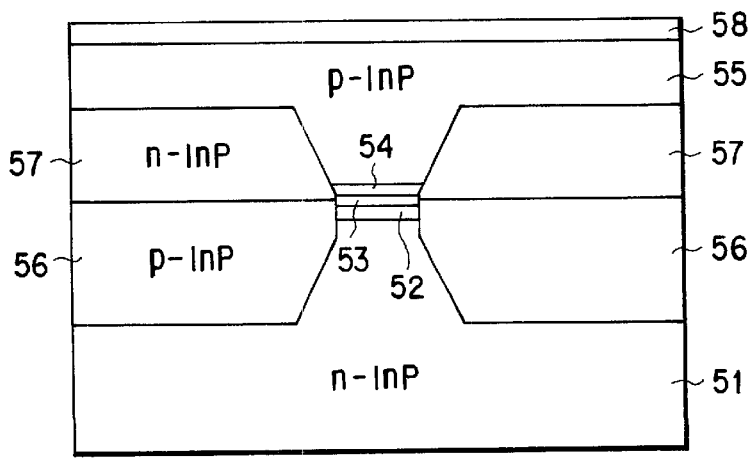
FIG. 5 is a sectional view showing the structure of a conventional 1.48-$\mu$m semiconductor laser for exciting an erbium-doped fiber amplifier used in the field of optical fiber communication.

FIG. 2 shows an example of the carrier concentration distribution in the p-type cladding layers in the semiconductor laser of this embodiment.

In the carrier concentration distribution shown in FIG. 2, a first portion 50 nm thick from the end portion of the active layer is lightly doped (the lightly doped p-type cladding layer 5).

A portion 100 nm thick from the end of this lightly doped p-type cladding layer 5 (i.e., a portion within the range of 50 to 150 nm from the end portion of the active layer 3) is heavily doped (the heavily doped p-type cladding layer 6).

A portion after this heavily doped p-type cladding layer 6 is moderately doped (the moderately doped p-type cladding layer 7).

Referring to FIG. 2, the solid line indicates the carrier concentration distribution when the cladding layers are stacked. The alternate long and short dashed line indicates the carrier concentration in the finally obtained semiconductor laser.

That is, Zn as a dopant diffuses in various heating steps in the semiconductor laser fabrication process, so the initial distribution (solid line) changes to the final distribution (alternate long and short dashed line).

Note that the SCH layer 4 is not shown in FIG. 2.

That is, the first 50-nm thick portion from the end portion of the active layer 3 is lightly doped as described above, and this distance of 50 nm includes the thickness of the SCH layer 4.

The subsequent heavily doped portion need not exist in the cladding layer, i.e., the heavily doped portion can exist in the SCH layer 4.

More specifically, a statement "the lightly doped p-type cladding layer 5, the heavily doped p-type cladding layer 6, and the moderately doped p-type cladding layer 7 are formed in the order named" in this specification means that layers lightly, heavily, and moderately doped with zinc (Zn) are formed in this order from the upper end of the active layer, regardless of whether each doped layer actually exists in the SCH layer 4 or the cladding layer (this relationship holds in the remainder of this specification).

The meaning of the shape of this concentration distribution of doped carriers will be described below.

The heavily doped p-type cladding layer 6 functions as a carrier block for blocking electrons overflowing from the active layer 3.

Since this heavily doped p-type cladding layer 6 is formed near the active layer 3, effective carrier blocking is performed, and a high-efficiency, high-output semiconductor laser is realized.

In crystal growth performed by metal organic vapor phase epitaxy, doping of about $1 \times 10^{18}/cm^3$ can be readily achieved. Therefore, this heavily doped p-type cladding layer 6 blocks and confines electrons into the active layer 3.

In the present invention, the heavily doped p-type cladding layer 6 is formed near the active layer 3 as described above and, more importantly, the lightly doped p-type cladding layer 5 is formed between this heavily doped p-type cladding layer 6 and the active layer 3.

This is done by taking account of high diffusibility of zinc (Zn).

That is, as can be seen from FIG. 2, when the lightly doped p-type cladding layer 5 is sandwiched between the heavily doped p-type cladding layer 6 and the active layer 3, Zn diffusing from the heavily doped p-type cladding layer 6 stops in the lightly doped p-type cladding layer 5 and does not reach the active layer 3.

Consequently, while effective carrier blocking is performed, it is possible to eliminate the shortcoming that the p-type dopant mixes into the active layer 3 to decrease the emission efficiency.

Accordingly, the lightly doped p-type cladding layer 5 is desirably undoped or doped at a low concentration of about $3 \times 10^{17}/cm^3$ or less.

The formation of the moderately doped p-type cladding layer 7 having a medium carrier concentration in the portion following the heavily doped p-type cladding layer 6 also contributes to the realization of high emission efficiency and high output.

That is, a portion heavily doped with Zn is necessary to block carriers. However, holes originally readily absorb light, so no unnecessarily heavily doped portion is preferably formed in a cladding layer.

In the present invention, therefore, this point is taken into consideration, and the region moderately doped with Zn (the moderately doped p-type cladding layer 7) is formed after the heavily doped p-type cladding layer 6 as a carrier blocking layer.

In this manner, the hole concentration in the whole cladding layers is prevented from becoming too high, thereby suppressing light absorption by holes.

When the conductivity and the like factors are taken into consideration, the moderately doped p-type cladding layer 7 occupying the most part of the cladding layers preferably has a carrier concentration of about $5 \times 10^{17}/cm^3$ as a whole.

When the lightly, heavily, and moderately doped p-type cladding layers 5, 6, and 7 are formed in this order as described above, the carrier concentration distribution has a concentration peak (maximum value) as indicated by the alternate long and short dashed line in FIG. 2.

That is, in this distribution the concentration decreases at least once from the position of this maximum value in a direction away from the active layer 3.

In the semiconductor laser of this embodiment, the concentrations in the layers 5, 6, and 7 are so adjusted that the position of this p-type dopant concentration peak (maximum value) is at a distance of 50 to 250 nm (preferably 50 to 150 nm) from the end of the active layer 3.

When this maximum value point is at a distance of about 50 to 250 nm (preferably 50 to 150 nm) from the active layer 3, diffusion of Zn does not reach the active layer 3.

In the semiconductor laser of this embodiment constructed as above, high emission efficiency can be obtained because electrons are well confined in the active layer and light loss caused by holes is small. Accordingly, the laser beam of this semiconductor laser has high output.

Figure 3:
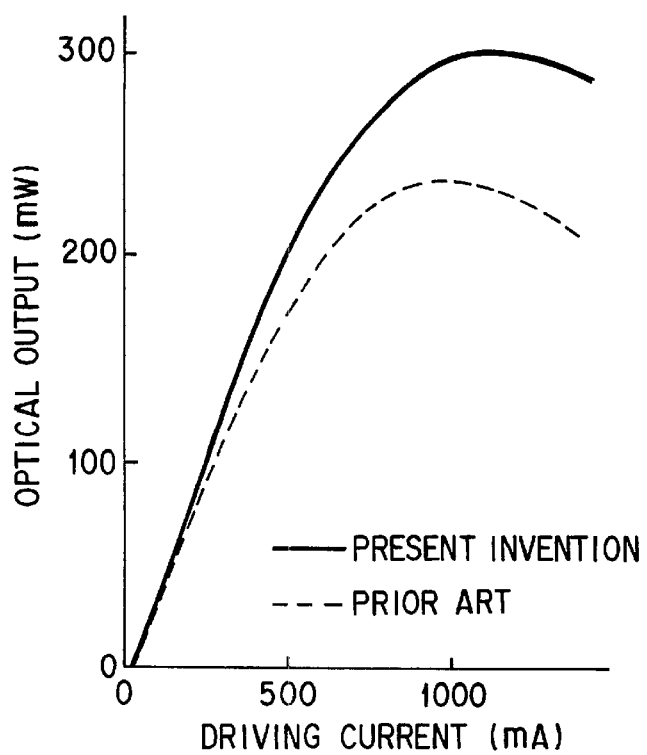
FIG. 3 is a graph showing the output characteristic of the semiconductor laser according to the embodiment of the present invention.

FIG. 3 is a graph showing the output characteristic of the semiconductor laser of this embodiment.

As shown in FIG. 3, the semiconductor laser of this embodiment realizes output higher by 20% or more than a semiconductor laser of prior art.

A procedure of fabricating the semiconductor laser shown in FIG. 3 will be described later.

The aforementioned maximum value need not probably be the maximum value of the carrier concentration in the cladding layers.

For example, presumably high emission efficiency as described above can be obtained even when a high carrier concentration point (maximum value) exists in a position farther than the maximum value position from the active layer 3.

The result of examination on the most effective distance of the maximum value position from the upper end of the active layer 3 will be described below.

Figure 4:
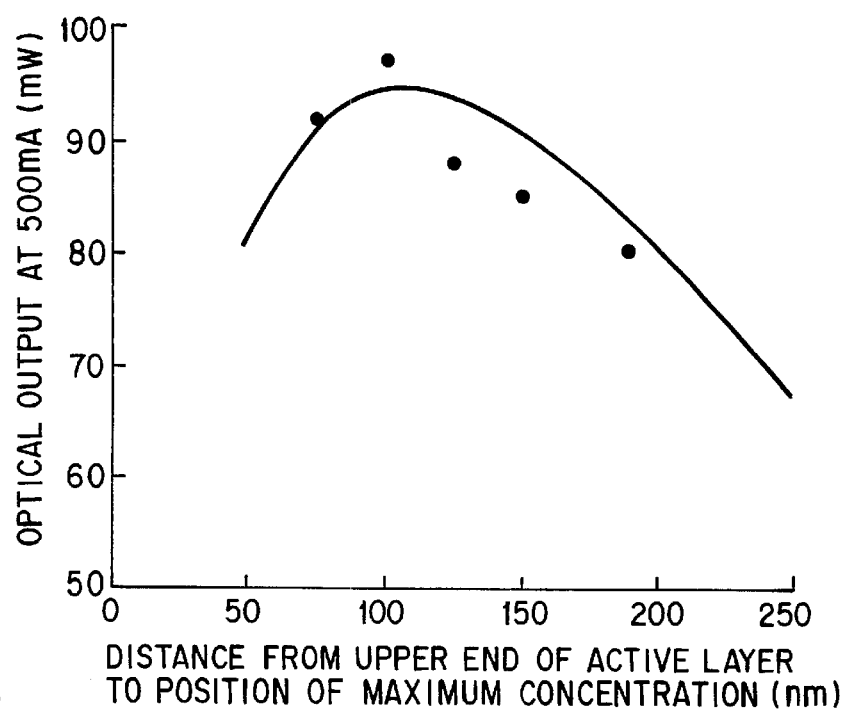
FIG. 4 is a graph showing the relationship between the distance from the upper end of an active layer to the maximum value of carrier concentration in the p-type cladding layers and the optical output.

FIG. 4 is a graph showing the relationship between the distance of the maximum value of the carrier concentration in the p-type cladding layers from the upper end of the active layer.

That is, a plurality of semiconductor lasers having carrier concentration distribution shapes shown in FIGS. 1 and 2 were formed such that the maximum value of the carrier concentration is the position of each plot in FIG. 4. FIG. 4 shows the result of measurement of optical output for an injected current of 500 mA.

In each semiconductor laser, the lightly doped p-type cladding layer 5 is an undoped layer, and neither a low- nor high-reflecting coating are formed.

The semiconductor laser shown in FIG. 3 has low-and high-reflecting coatings, and output light from the low-reflecting coating is measured. Therefore, the apparent optical output is larger than in FIG. 4.

As shown in FIG. 4, to obtain a high-output semiconductor laser, an optimum distance from the upper end of the active layer to the position of the maximum value is about 100 nm.

When this distance is about 50 to 250 nm, a semiconductor laser having high light emission efficiency and high output can be obtained. More preferably, a considerably large output increasing effect can be obtained when the distance to the maximum value is about 50 to 150 nm.

In the semiconductor laser shown in FIG. 4, the lightly doped p-type cladding layer 5 is an undoped layer.

When the cladding layer 5 is lightly doped, the optical output does not become lower than that shown in FIG. 4 even if the position of the maximum concentration is farther from the upper end of the active layer.

In the semiconductor laser according to this embodiment of the present invention as described above, the heavily doped p-type cladding layer 6 is formed near the active layer 3 with the lightly doped p-type cladding layer 5 sandwiched between them. Therefore, even when Zn is used as a p-type dopant, this p-type dopant does not diffuse to the active layer 3. Additionally, electrons are well confined in the active layer 3 by blocking by the heavily doped layer 6. Consequently, high emission efficiency and high output can be realized.

Also, in the semiconductor laser of this embodiment, the moderately doped p-type cladding layer 7 is formed subsequently to the heavily doped p-type cladding layer 6 so that the final carrier concentration distribution takes a maximum value in the heavily doped p-type cladding layer 6. Additionally, the position of this maximum value is set within a predetermined range from the upper end of the active layer. Consequently, in addition to the above effects, absorption of light in the p-type cladding layers by holes can be minimized. This further increases the laser output.

(Practical Example)

A practical example when the semiconductor laser according to the above embodiment is fabricated will be described below.

This practical example relates to steps of fabricating a 1.48-$\mu$m semiconductor laser for exciting an erbium-doped fiber amplifier used in the field of optical fiber communication. The structure of this semiconductor laser is the same as shown in FIG. 1.

First, InGaAsP layers having compositions by which the bandgap wavelengths are 1.15, 1.08, and 0.99 $\mu$m and each having a thickness of 30 nm are stacked on an n-type InP substrate 1 having a carrier concentration of $1\times10^{18}/cm^3$ by using MOVPE, thereby forming an SCH layer 2.

A multiple quantum well structure active layer 3 having four well layers are grown on the SCH layer 2 by forming InGaAsP layers, in which −0.5% of tensile strain is introduced to a composition by which the bandgap wavelength is 1.25 $\mu$m with no strain, as barrier layers, and InGaAsP layers, in which +1% of compression strain is introduced to a composition by which the bandgap wavelength is 1.55 $\mu$m, as well layers.

Subsequently, InGaAsP layers having compositions by which the bandgap wavelengths are 0.99, 1.08, and 1.15 $\mu$m and each having a thickness of 30 nm are stacked on the active layer 3, thereby forming an SCH layer 4.

On this SCH layer 4, an undoped 50-nm thick InP layer, a p-type 100-nm thick InP layer having a carrier concentration of $1\times10^{18}/cm^3$, and a p-type 300-nm thick InP layer having a carrier concentration of $5\times10^{17}/cm^3$ are stacked in this order as a lightly doped p-type cladding layer 5, a heavily doped p-type cladding layer 6, and a moderately doped p-type cladding layer 7, respectively, thereby forming the p-type cladding layers 5, 6, and 7.

The dopant is zinc (Zn), and the carrier concentration of the lightly doped p-type cladding layer 5 can be about $3\times10^{17}/cm^3$.

An $SiO_2$ film about a few tens of nm thick is deposited on the p-type cladding layer 7 by plasma CVD or the like. This $SiO_2$ film is formed into a stripe about 2 $\mu$m wide by photolithography to form an etching mask.

The resultant structure is dipped into an etching solution consisting of sulfuric acid, oxalic acid, and hydrochloric acid using this stripe $SiO_2$ film as an etching mask, thereby forming a mesa shape.

Subsequently, the $SiO_2$ film is used as a growth inhibiting mask to sequentially stack and bury a p-type InP buried layer 9 and an n-type InP buried layer 10 in the mesa by MOVPE.

After that, a 2-$\mu$m thick p-type InP cladding layer 7 having a carrier concentration of $5\times10^{17}/cm^3$ is grown on the entire surface from which the $SiO_2$ film is removed.

Additionally, a 0.5-$\mu$m thick p-type InGaAs contact layer 8 having a carrier concentration of $5\times10^{18}/cm^3$ is grown.

Finally, the n-type InP substrate 1 is polished to have a thickness of about 100 $\mu$m, a p-type electrode 12 containing Au and Zn is formed on the growth surface by vapor deposition, and an n-type electrode 11 containing Au and Ge is formed on the substrate surface by vapor deposition.

These n- and p-type electrodes 11 and 12 are plated with Au.

Furthermore, the end faces on the two sides are cleaved, and a dielectric film as a low-reflecting coating or high-reflecting coating is formed on the cleaved end faces by vapor deposition or the like.

The injected current-optical output characteristic of the present invention shown in FIG. 3 of the above embodiment is the characteristic measured for the semiconductor laser fabricated as above.

The characteristic of the semiconductor laser according to the prior art shown in FIG. 3 is measured for a device fabricated by setting the carrier concentrations of all p-type cladding layers to a fixed value of $5\times10^{17}/cm^3$ for comparison.

FIG. 3 shows that the optical output of the semiconductor laser according to the embodiment of the present invention is higher by 20% or more than that of the semiconductor laser of the prior art when the injected current is 500 A.

The present invention is not limited to the above embodiment and practical example and can be modified without departing from the scope of the invention.

For example, in the practical example the present invention has three GRIN SCH layers and a strained MQW structure active layer having four well layers. However, the present invention is not limited to these structures and is applicable to semiconductor lasers having various structures.

In the present invention as has been described in detail above, a heavily doped region is formed with a lightly doped region sandwiched between an active layer and the heavily doped region. Therefore, it is possible to provide a semiconductor laser capable of preventing diffusion of a p-type dopant to an active layer while performing sufficient carrier blocking, even when Zn is used as a p-type dopant, and obtaining high emission efficiency and high output by minimizing light absorption in a p-type cladding layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser comprising:

an n-type semiconductor substrate;

an active layer formed on said n-type semiconductor substrate; and a p-type cladding layer formed on said active layer, wherein said p-type cladding layer being formed such that regions doped with a p-type dopant are formed in an order of a first lightly doped or undoped region acting as a diffusion preventing layer in a region near the active layer to prevent diffusion of the p-type dopant to the active layer, a heavily doped region acting as a carrier blocking layer to block carriers from the active layer and confine the carriers in the active layer when the semiconductor laser is in operation, and a second lightly doped region acting as a light absorption inhibiting layer to inhibit absorption of light by holes when semiconductor laser is in operation from a region closest to said active layer in a stacking direction, and wherein a maximum value of concentration of the p-type dopant exists in said heavily doped region within a range of 50 to 250 nm in the stacking direction from said active layer.

2. A laser according to claim 1, wherein the p-type dopant is zinc.

3. A laser according to claim 2, wherein a concentration distribution of the p-type dopant from said active layer to said p-type cladding layer has at least one maximum value with, the undoped region or lightly doped region sandwiched between the end of said active layer and said heavily doped region.

4. A laser according to claim 1, wherein a material system is InGaAsP/InP.

5. A laser according to claim 1, wherein the maximum value of the p-type dopant concentration is not less than $1\times10^{18}/cm^3$.

6. A laser according to claim 1, wherein the minimum value of the p-type dopant concentration is not more than $3\times10^{17}/cm^3$ between the end of said active layer and said heavily doped region.

7. A laser according to claim 1, further comprising a separate confinement heterostructure layer between said active layer and said p-type cladding layer.

8. A laser according to claim 1, wherein said active layer has a multiple quantum well structure.

9. A method of fabricating a semiconductor laser, comprising the steps of:

forming an active layer on an n-type semiconductor substrate; and forming a p-type cladding layer by doping a p-type dopant into the form of a stacked structure on said active layer, the step of forming said p-type cladding layer comprising:

forming a p-type dopant diffusion preventing layer in a region near said active layer to prevent diffusion of the p-type dopant to said active layer during a fabrication process of said semiconductor laser;

forming a carrier blocking layer on said p-type dopant diffusion preventing layer to block carriers overflowing from said active layer and confine the carriers in said active layer when said semiconductor laser is in operation; and forming a light absorption inhibiting layer on said carrier blocking layer to inhibit absorption of light by holes when said semiconductor laser is in operation.

* * * * *